United States Patent [19]

Akamatsu

[11] 4,107,551

[45] Aug. 15, 1978

[54] THYRISTOR TURN-OFF SYSTEM

[75] Inventor: Masahiko Akamatsu, Amagasaki, Japan

[73] Assignee: Mitsubishi Denki Kabushiki Kaisha, Tokyo, Japan

[21] Appl. No.: 698,112

[22] Filed: Jun. 21, 1976

Related U.S. Application Data

[63] Continuation-in-part of Ser. No. 545,906, Jan. 31, 1975, abandoned.

[30] Foreign Application Priority Data

Apr. 17, 1973 [JP] Japan .................................. 48-43392

[51] Int. Cl.² ............................................ H03K 17/72
[52] U.S. Cl. ............................ 307/252 J; 307/252 M; 307/305
[58] Field of Search .......... 307/252 A, 252 N, 252 M, 307/252 J, 305; 323/22 SC

[56] References Cited

U.S. PATENT DOCUMENTS

| 3,404,293 | 10/1968 | Harris et al. | 307/252 J |
| 3,488,522 | 1/1970 | Cameron et al. | 307/305 X |
| 3,622,806 | 11/1971 | Williams | 307/252 N |
| 3,714,467 | 1/1973 | Kariya et al. | 307/252 A |

Primary Examiner—John Zazworsky
Attorney, Agent, or Firm—Oblon, Fisher, Spivak, McClelland & Maier

[57] ABSTRACT

A thyristor turn-off system comprising: a thyristor having at least an anode, a cathode and a gate; a first reverse-bias means for applying reverse-bias between said anode and said cathode of the thyristor; a second reverse-bias means for applying reverse-bias to said gate of the thyristor; means for applying reverse-bias to said gate of the thyristor by said second reverse-bias means during the time of or before or after the forward bias initiation time for shifting between said anode and said cathode of the thyristor from reverse-bias to forward bias; whereby a failure of turn-off of the thyristor is prevented by said gate reverse-bias at least after said forward bias initiation time.

7 Claims, 22 Drawing Figures

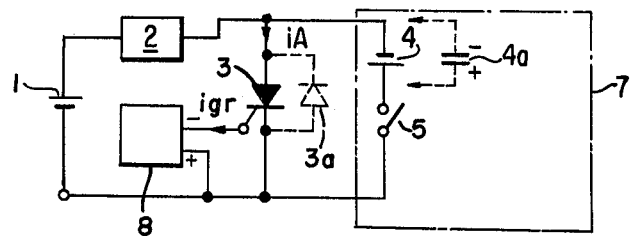
FIG.1
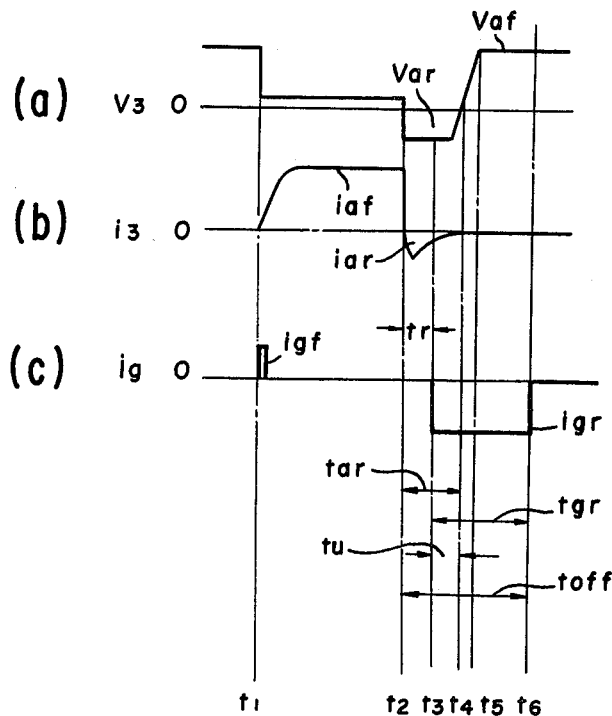
FIG.2
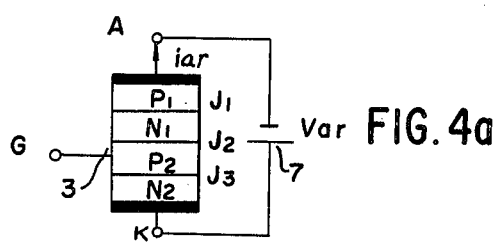
FIG.4a
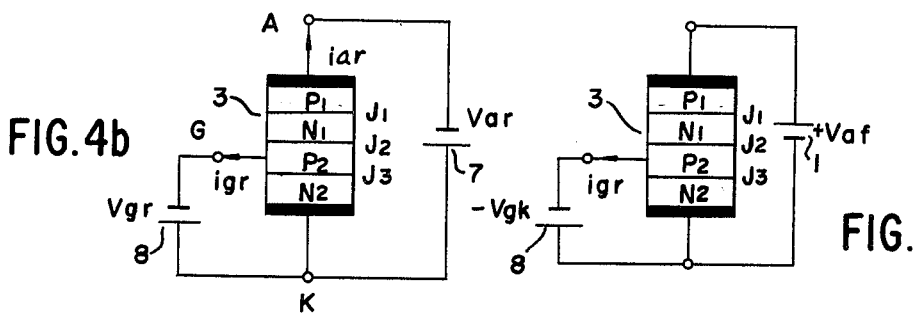

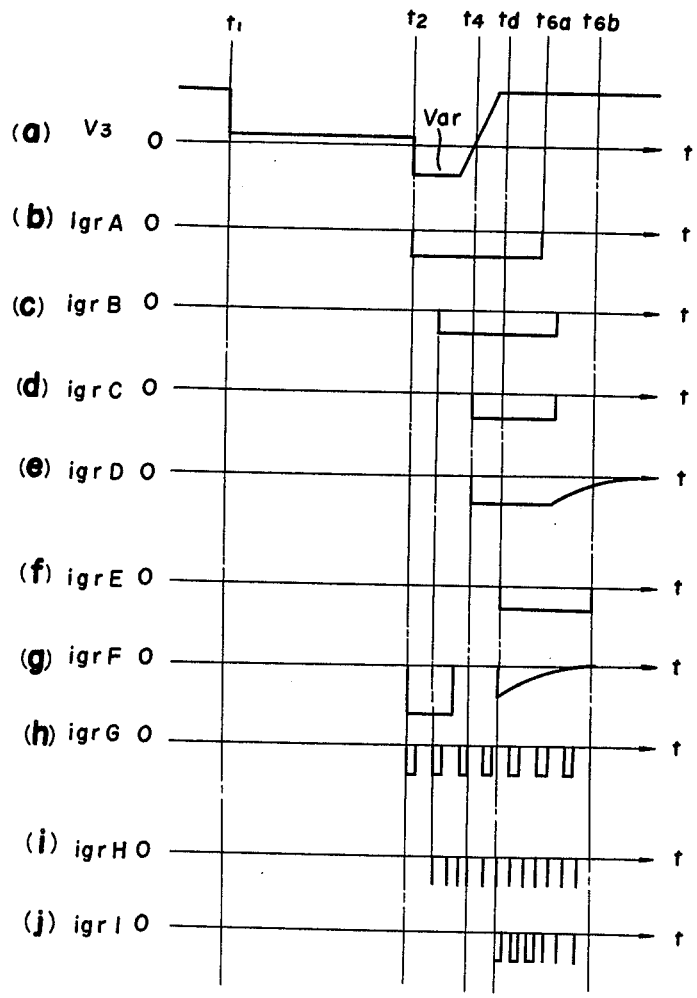
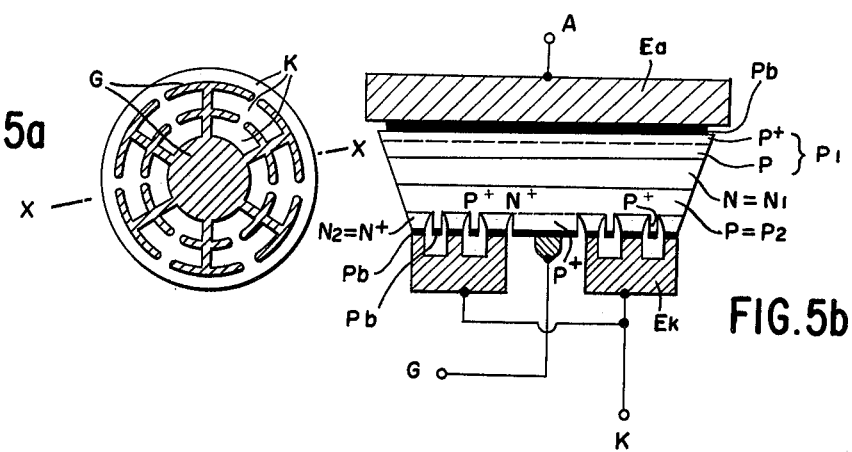

THYRISTOR TURN-OFF SYSTEM

CROSS-REFERENCE TO RELATED APPLICATIONS

This application is a continuation-in-part of U.S. application Ser. No. 545,906, filed Jan. 31, 1975, and now abandoned.

BACKGROUND OF THE INVENTION

1. Field of the Invention

The present invention relates to a thyristor turn-off system for shortening the turn-off period and simplifying the turn-off means.

2. Description of the Prior Art

As is known, a turn-off of the conventional thyristor has been performed by reverse-biasing between an anode and a cathode for a specific period. According to the conventional turn-off system, a turn-off period must usually be greater than 10 μ sec.. It has been difficult to shorten the turn-off period for a current thyristor of higher than 50 A or a high voltage thyristor, for example, higher than 800 V. Accordingly, complicated turn-off means has been required and the loss for the turn-off has been large. The disadvantages have been great in the case of high frequency switching.

As is known in the conventional gate turn-off thyristor, the thyristor is turned off by reverse-biasing the gate. It has been hard to use the gate turn-off thyristor for large current such as greater than 10 A or for high voltage such as higher than 600 V. On the other hand, it has been difficult to use a transistor for current of greater than about 30 A and high voltage of higher than 300 V. Even though the static break over voltage $V_{ceo}$ or $V_{cbo}$ can be higher than 300 V, it has been difficult to use it for high speed high frequency switching because of the break down by switching power.

An allowable surge current of a transistor is smaller than that of a thyristor. Accordingly, it is not feasible to use a transistor for a high power switching purpose. Accordingly, it has not been possible to overcome the disadvantages of a thyristor by a transistor.

SUMMARY OF THE INVENTION

The present invention is to overcome the disadvantages of the conventional power switching elements.

It is an object of the present invention to provide a thyristor turn-off system for decreasing the turn-off period of the thyristor, simplifying the turn-off means and decreasing the loss required for the gate reverse-bias by reverse-biasing between the anode and cathode of the thyristor and reverse-biasing the gate thereof.

The foregoing and other objects are attained in accordance with one aspect of the present invention, through the provision of a thyristor turn-off system comprising: a thyristor having at least an anode, a cathode and a gate; a first reverse-bias means for applying reverse-bias between said anode and said cathode of the thyristor; a second reverse-bias means for applying reverse-bias to said gate of the thyristor; means for applying reverse-bias to said gate of the thyristor by said second reverse-bias means during the time of or before or after the forward bias initiation time for shifting between said anode and said cathode of the thyristor from reverse-bias to forward bias; whereby a failure of turn-off of the thyristor is prevented by said gate reverse-bias at least after said forward bias initiation time.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which:

FIG. 1 is a connection diagram for illustrating one embodiment of the thyristor turn-off system according to the invention;

FIG. 2, a–c, and FIG. 3, a–j, are waveforms for illustrating the operation of the system;

FIGS. 4a, 4b and 4c are diagrams of a conceptual circuit model for illustrating the operation of the system;

FIG. 5a is a side view of a cathode for illustrating a schematic structure of a suitable thyristor element for applying the thyristor turn-off system;

FIG. 5b is a sectional view taken along the line X — X of FIG. 5a;

DETAILED DESCRIPTION OF THE PREFERRED EMBODIMENTS

Figure 6:
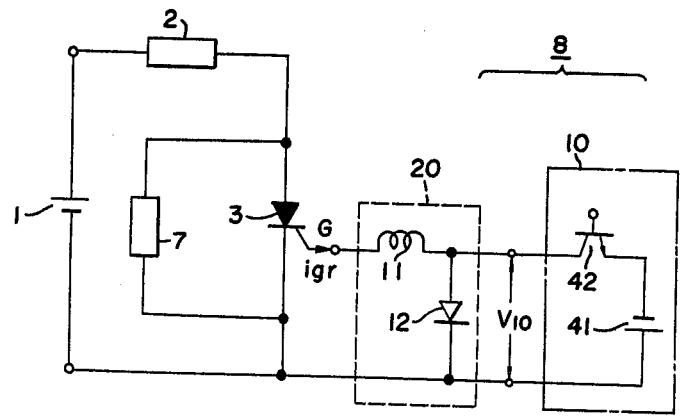
FIG. 6 is a connection diagram of the first embodiment of the thyristor turn-off system according to the invention.

Referring now to the drawings, wherein like reference numerals designate identical or corresponding parts throughout the several views, and more particularly to FIG. 1 thereof;

FIG. 1 is a connection diagram for illustrating the thyristor turn-off system of the invention wherein a load 2 and a thyristor 3 are connected in series between positive and negative poles of a DC power source 1. A series circuit of an anode reverse bias power source 4 and an anode reverse-bias switch 5 is connected in parallel to the thyristor 3 so as to form the first reverse-bias means 7 consisting of the anode reverse-bias power source 4 and the anode reverse-bias switch 5. The anode reverse-bias power source 4 can be replaced by an anode reverse-bias capacitor 4a as shown by the dotted line. The second reverse-bias means 8 is to reverse-bias the gate of thyristor 3, and is connected to the gate and cathode of the thyristor 3.

Referring to FIG. 2, a–c, the operation of the system will be illustrated. At the time $t_1$, the turn-on pulse $i_{gf}$ is applied to the gate of thyristor 3 as shown in FIG. 2c so as to turn on the thyristor 3, whereby the forward current $i_{af}$ shown in FIG. 2b is passed to the thyristor 3. During the period, the voltage $V_3$ of the thyristor 3 is only the forward voltage drop as shown in FIG. 2a. When the thyristor 3 is turned off, the anode reverse-bias switch 5 is turned on whereby the anode reverse-bias voltage $V_{ar}$ (FIG. 2a) is applied to the anode of thyristor 3 by the first reverse-bias means 7 from the time $t_2$ to $t_4$. Then, at the time $t_5$, the voltage of the thyristor reaches normal forward voltage $V_{af}$. The period $t_4 - t_5$ is a transient restriking forward voltage increase period. The period $t_2 - t_4$ is an anode reverse-bias period $t_{ar}$.

On the other hand, as stated above, the reverse current $i_{ar}$ (FIG. 2b) is fed from the time $t_2$ as the current $i_3$ of the thyristor 3 by applying a reverse-bias voltage to the anode of the thyristor 3 so as to discharge the stored carriers. The anode reverse-bias is stopped from the time $t_3 - t_4$ when the discharge of the stored carriers is substantially finished and the reverse current $i_{ar}$ is substantially zero. Then, the forward voltage begins to apply and the gate reverse-bias current $i_{gr}$ begins to feed to the gate of thyristor 3 by the second reverse-bias means 8 at the time $t_3$ between the period $t_2 - t_4$. The period $t_3 - t_4$ is an overlapping period $t_u$ (FIG. 2c) for the anode reverse-bias and the gate reverse-bias. It is, of course, preferable to have an overlapping period $t_u$. However, it is not indispensable and it is possible to have $t_u = 0$ or $t_u < 0$ and $t_3 > t_4$. That is, the preliminary result of the invention can be attained by applying the gate reverse-bias at the time of passing the zero point from the finish of the anode reverse-bias to the forward voltage $t_4$ ($t_3 = t_4$, $t_u = 0$) or at the time delaying a certain period $t_d$ (delay time for breakover as the junction $J_2$ is not sufficiently recovered; such as several $\mu$ sec. - several tens $\mu$ sec.). An object of the invention, to be illustrated later, is to prevent the failure of turn-off by break-over after a certain delay) from the blocking of the forward voltage once in the condition of incomplete recovery of the junction $J_2$.

In order to illustrate the problem, the waveform of the voltage $V_3$ of the thyristor 3 is shown in FIG. 3a, and the time relations of the gate reverse-bias are shown in FIG. 3, b–j. FIGS. 3, b and c, shows applying the gate reverse-bias during the period including the forward bias initiation time $t_4$. FIGS. 3, d and e, shows applying the gate reverse-bias just after the forward-bias initiation time $t_4$. FIG. 3f shows applying the gate reverse-bias after delay of the time $t_d$ from the time $t_4$. FIG. 3g shows applying the gate reverse-bias before and after the forward-bias initiation time $t_4$. FIG. 3, h–j, shows applying gate reverse-bias by the pulse-train corresponding to FIGS. 3, b, c and f.

The breakover after the reapplication of the forward voltage can be caused after a certain delay in many cases. Accordingly, the result of preventing the breakover can be expected even by application of the reverse-bias by the pulse train. In accordance with the pulse train reverse-bias system, the main circuit and the insulation (pulse transformer, etc.) as the gate reverse-bias means can be miniaturized. The common feature is to apply the gate reverse-bias after the forward voltage initiation time $t_4$ and at least before the breakover delay time $t_d$. This is the first feature of the invention.

One of the more important features of the invention is to continuously apply the gate reverse-bias even after the finish of the anode reverse-bias (after restriking the forward voltage initiation time $t_4$) until the time $t_6$. The gate reverse-bias period $t_{gr}$ occurs during the period $t_3 - t_6$. Another feature of the invention is to gradually decrease the reverse-bias current after applying the forward voltage. The feature will be illustrated later.

FIGS. 4a, 4b and 4c are equivalent circuit diagrams showing the connection in each period to the time charts of the waveforms of FIG. 2, a–c. In FIGS. 4a, 4b and 4c the thyristor 3 has a PNPN four layer structure and has an anode A, a cathode K, and a gate G. FIGS. 4a, 4b and 4c show the cathode side gate (P gate). (In the case of the anode side gate (N gate), a gate electrode is provided in the first N layer ($N_1$)).

The P gate type thyristor will now be described. In the case of FIG. 4a, only the anode reverse-bias voltage $V_{ar}$ is applied during the period $t_2 - t_3$ of FIG. 2, a–c. During the period, the carriers around the junctions $J_1$, $J_3$ are discharged by the reverse current $i_{ar}$. When the carriers around the junctions $J_1$, $J_3$ are discharged, the reverse voltage is maintained by the junction $J_2$ to prevent the discharge. However, the carriers around the junction $J_2$ still remain and the forward voltage blocking ability is not recovered until the completion of recombination. (In the conventional turn-off using only the anode reverse-bias, the period for completion of the recombination is too long, and is substantially the turn-off time).

FIG. 4b shows the connection mode during the overlapping period $t_u$ for the period $t_3 - t_4$. In this case, it is possible to have $t_2 = t_3$, that is, to apply simultaneously the anode reverse-bias and the gate reverse-bias. In the state of FIG. 4b, the discharge of the remaining carriers around the junctions $J_2$, $J_3$ continues from anode reverse-bias $V_{ar}$. In FIG. 4a, the small number of remaining carriers around the junctions $J_1$, $J_3$ are discharged. On the other hand, a large number of remaining carriers around the junction $J_2$ is discharged by the gate reverse-bias $i_{gr}$.

However, in the case of $t_2 = t_3$, that is the simultaneous application of the anode reverse-bias and the gate reverse-bias from the beginning, (applying the gate reverse-bias at the time a large number of carriers remains around the junctions $J_1$, $J_3$ to pass the reverse current $i_{ar}$ and at the time recovering insufficient reverse-blocking ability), the junction $J_2$ is forwardly biased by the anode reverse-current $i_{ar}$ by the anode reverse-bias whereby the discharge of carriers around the junction $J_2$ as the purpose of the gate reverse-bias (the recovery of blocking ability of the junction $J_2$) is prevented. The junction $J_2$ is forwardly biased around the gate electrode by the loop of cathode terminal K-second reverse bias means 8-gate electrode G-second P layer $P_2$-first N layer $N_1$-first P layer $P_1$-anode electrode A-first reverse-bias means 7.

The gate current $i_g$ can be forwardly passed by overcoming the second reverse-bias means 8. It is immaterial whether the gate reverse-bias is applied before the recovery of the junctions $J_1$, $J_3$, that is, before sufficient decrease of the anode reverse current $i_{ar}$. This causes loss of the gate reverse-bias circuit. That is, the optimum method is to apply the gate reverse-bias after sufficient decrease of the anode reverse current $i_{ar}$. The delay feature of the gate reverse-bias time $t_3$ from the anode reverse-bias initiation time $t_2$ is one of the features of the invention. After the anode reverse current $i_{ar}$ by the anode reverse-bias is satisfactorily decreased in the mode of FIG. 4b, and after the reverse current blocking ability of the junctions $J_1$, $J_3$ is sufficiently recovered, a large number of the remaining carriers around the junction $J_2$ by the gate reverse-bias current are discharged. The junction $J_2$ will be recovered.

When the junction $J_1$ is recovered and the shared voltage $V_{J1}$ of the reverse voltage of the junction $J_1$ reaches higher than the difference between the anode reverse voltage $V_{ar}$ and the gate reverse voltage $V_{gr}$ (that is to cause the potential of the $N_1$ layer at the junction $J_2$ surface region to be higher than the potential of the $P_2$ layer (gate layer), the junction $J_2$ is reversely biased to obtain the reverse recovery (recovery of forward direction blocking ability). As is apparent from the description, the discharge and recovery of the carriers of the junction $J_2$ by the gate reverse bias (recovery of forward direction blocking ability, that is, turn-off) is highly dependent upon the recovery of the junction $J_1$ layer by the anode reverse-bias. But, from the viewpoint of the gate reverse-bias (recovery of junction $J_2$), the anode reverse-bias is forwardly biasing the junction $J_2$ and is disturbing the recovery of the junction $J_2$. This is a disadvantage compared to the case of the gate reverse-bias as $V_{ar} = 0$. Accordingly, it is the optimum that the junction $J_2$ is recovered by applying the gate reverse-bias during the period for the resulting nearly zero of the anode reverse-bias voltage after sufficient decrease of the reverse current $i_{ar}$ in FIG. 2b (after the time $t_3$).

It is also preferable to apply the gate reverse-bias during the period that the voltage between the anode and cathode $V_3$ (absolute value) is lower than the gate reverse-bias voltage $V_{gr}$ (period for $(V_{gr} - |V_3|) > 0$) which is prolonged by the slow change from the reverse voltage to the forward voltage. Accordingly, it is effective to provide the reverse parallel diode 3a as shown in the dotted line as the thyristor 3 of FIG. 1. It is especially preferable to use a diode whose turn-on is delayed from the time $t_r$ for reverse direction recovery or a diode whose impedance is partially connected to an outer part or a diode whose forward voltage drop is relatively high.

The conventional turn-off method requires a large current to reverse bias the gate or a long time for natural recombination of carriers around junction $J_2$ because it is possible to only charge carriers around junction $J_2$ by reverse anode current, and it is not possible to discharge carriers after the reverse anode current has nearly decreased to zero, and the polarity of the electric field around junction $J_2$ is forward during $t_2 - t_4$. Accordingly, the gate reverse-bias is applied until after the forward voltage initiating time $t_4$. This is a primary feature of the invention. FIG. 4c shows the mode in the period of only the gate reverse-bias $(t_4 - t_5)$ after the anode reverse-bias.

Referring to FIG. 4c, this feature will be described. The forward recovering current of the junction $J_2$ is derived as the gate reverse-bias current through the gate in the conditions that the junction $J_2$ is not completely recovered and the forward leakage current is greater than the normal forward leakage current whereby the amount of the carriers reaching the junction $J_3$ and fourth layer is decreased (or blocked) and the current amplification factor $\alpha_2$ of the transistor of $N_1$-$P_2$-$N_2$ is decreased (or operation stopped) so as to prevent breakover (forward direction turn-on). In order to prevent forward direction breakover after decreasing the carriers, the anode reverse-biasing period $(t_2 - t_4)$ takes quite a long time compared to the reverse current period $t_r$ in the conventional turn-off method. However, in this invention the period can be shortened by prolonging the gate reverse-bias period until after the forward voltage initiation whereby the longest period for recombination of the turn-off interval of the thyristor can be eliminated. Moreover in comparison with only applying the reverse-bias current to the gate as the gate turn-on and off thyristor, the gate reverse-bias current can be quite small as it is the time just after discharging a large number of carriers.

As illustrated in the mode of FIG. 4b, the gate reverse-bias has the disadvantage in the mode whereby a satisfactory result cannot be expected. In the forward direction blocking ability of the reapplication of forward voltage in which a small number of remaining carriers is seriously affected, the effect of both reverse-biases is small as in the case of FIG. 4b. On the contrary, the optimum result can be realized by prolonging the gate reverse-bias until after reapplication of the forward voltage. Without this feature, the result is substantially similar to that of the case of turn-off by only anode reverse-bias or turn-off by only a gate reverse-bias. This is an important feature of the invention.

The following are detailed embodiments of the invention. FIG. 5a and 5b, show a thyristor for attaining the result of the invention, and are a schematic structure of the basic element.

FIG. 5a is a side view of the basic element in the cathode side, wherein the slant lines portion of the radial pattern is a gate electrode surface, and the margin is the cathode electrode surface and the full line shows the boundary thereof.

FIG. 5b is a sectional schematic view taken along the line X—X of FIG. 5a, wherein Ea (slant lines portion) designates an anode electrode; Ek designates a cathode electrode; and Pb designates a metallized electrode jointing layer for the anode, cathode and gate. The anode side P+ and P designates the first P layer $P_1$; N designates the first N layer (base layer) $N_1$; the next P designates the second P layer $P_2$; the gate side P+ designates a gate layer; and the cathode side N+ designates the second N layer $N_2$. The gate region is smaller than that of the conventional gate turn-off thyristor. However, the suction of the forward leakage current to the gate and the disturbance of the current amplification in the mode of FIG. 4c can be effectively attained by providing a broad gate region such as that of the conventional gate turn-off thyristor.

FIG. 6 is a diagram of one embodiment for applying the gate reverse-bias according to the system of the invention wherein a load 2 and a thyristor 3 are connected in series between the positive pole and the negative pole of the DC power source; and the first reverse-bias means 7 is connected between the anode and the cathode of the thyristor 3. The second reverse-bias means 8 consists of the gate reverse-bias pulse generating means 10 and the gate reverse-bias gate circuit 20. The gate reverse-bias pulse generating means 10 comprises a gate reverse-bias power source 41 and a gate reverse-bias switch 42. The gate reverse-bias gate circuit 20 comprises an inductive element 11 connected to the gate G of the thyristor and a gate reverse current wheeling diode 12.

Figure 7:
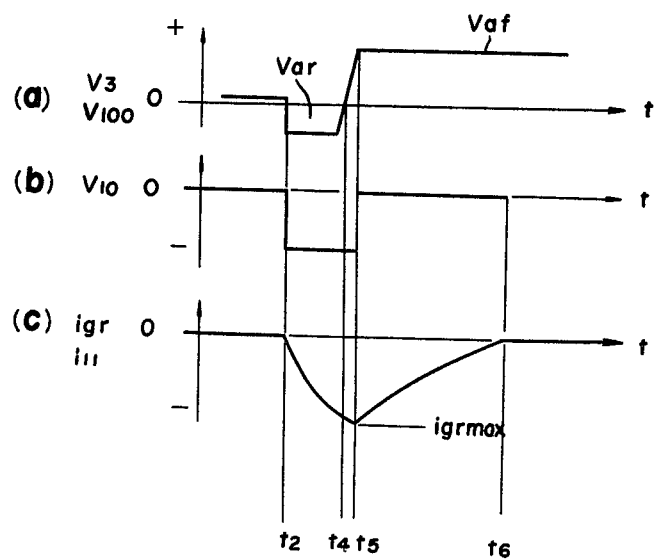
FIG. 7, a–c, shows waveforms for illustrating the operation of the system of FIG. 6.

FIG. 7, a–c, shows are time charts of turn-off waveforms in the circuit of FIG. 6. In FIG. 7a, $V_3$ and $V_{100}$ designate the voltage between the main electrodes of the thyristor 3. The anode reverse-bias is initiated at the time $t_2$ and is finished at the time $t_4$. On the contrary, the gate reverse-bias pulse generation 10 generates the reverse voltage $V_{10}$ shown in FIG. 7b by the turn-on of the gate reverse-bias switch 42 during the period $t_2$– $t_5$ wherein the time $t_4$ and $t_5$ can be slightly different. During the period the reverse pulse voltage $V_{10}$ is applied, the reverse gate current $i_{gr}$, that is, the current $i_{11}$ of the inductive element 11 (FIG. 7c), increases to reach the maximum at the time $t_5$ (the time the reverse bias voltage $V_3$ is extinguished). After the time $t_5$, the gate reverse current $i_{gr} = i_{11}$ is commutated to the diode and the reverse gate current is prolonged to the time $t_5$ by the effect of the inductive element 11 to gradually decrease to zero at the time $t_6$.

Thus, the large reverse gate current can be kept about the forward direction initiating time $t_4$ to impart the optimum gate reverse-bias effect whereby the gate reverse-bias can be prolonged until after the application of the forward voltage for imparting the optimum forward direction blocking ability. The optimum gate reverse-bias means for the principle of the invention can thus be obtained. Even though the gate reverse-bias gate circuit 20 has no series resistance, the reverse gate current can be decided by the inductive element 11 and the voltage-time product of reverse pulse voltage $V_{10}$. With regard to the gate reverse-bias which requires a larger gate current than the turn-on gate current, the gate reverse-bias power consumption can be greatly decreased. Moreover, the inductive element 11 acts as a high impedance to the application of the turn-on gate pulse so as to prevent a shunt of the turn-on gate current.

Figure 8:
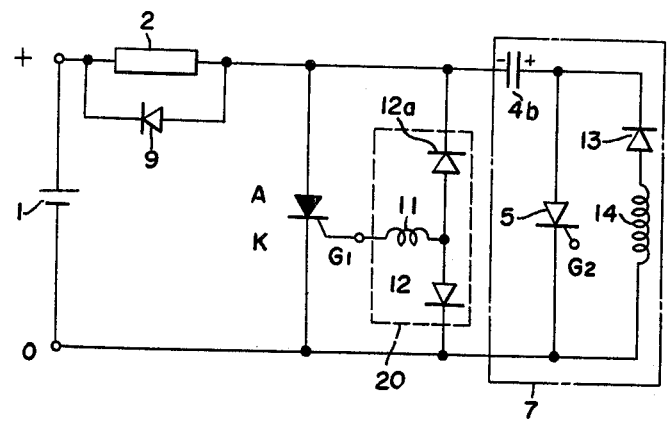
FIG. 8 is a circuit diagram of the second embodiment of the thyristor turn-off system according to the invention.

FIG: 8 is a diagram of another embodiment of the invention which includes the anode reverse-bias means. In the embodiment of FIG. 8, the anode reverse-bias means is used for both of the gate reverse-bias pulse generating means 10 of the embodiment of FIG. 6 and the first reverse-bias means. In FIG. 8, the load 2 and the thyristor 3 are connected in series between the positive terminal and the negative terminal of the power source and the diode 9 is connected in parallel to the load 2. The reference 4b in the first reverse-bias means 7 is a turn-off capacitor which is used instead of the anode reverse-bias power source 4 in FIG. 1; an anode reverse-bias switch 5 is a turn-off thyristor in this embodiment. The series circuit of the turn-off capacitor 4b and the anode reverse-bias switch 5 is connected in parallel to the thyristor 3. The series circuit of the diode 13 and the reactor 14 is connected in parallel to the anode reverse-bias switch 5 whereby the first reverse-bias means 7 is formed. The series-connected diodes 12, 12a are connected in reverse polarity in parallel to the thyristor 3. The conjunction of the diodes 12, 12a is connected through the inductive element 11 to the gate of the thyristor 3 whereby the gate reverse-bias gate circuit 20 as shown by the dotted line is formed.

Figure 9:
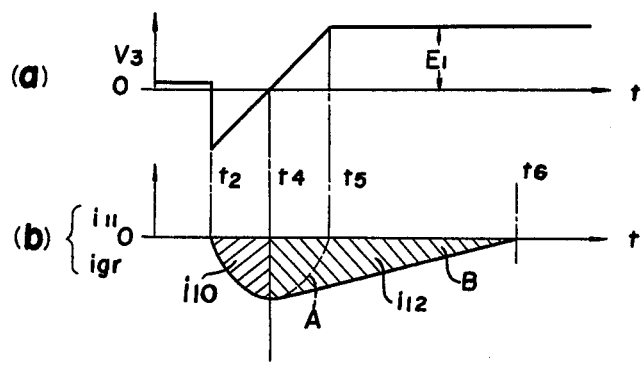
FIG. 9, a and b, shows time charts of waveforms for illustrating the operation of the system of FIG. 8.

In FIG. 8, the turn-off capacitor 4b is charged through the anode reverse-bias switch 5 in the reverse polarity to that of FIG. 8 during the period of off state of the thyristor 3. When thyristor 3 is turned on, the polarity is changed to that of FIG. 8 through the circuit of reactor 14 - diode 13 - turn-off capacitor 4b - thyristor 3. The thyristor 3 is thereby charged. In the case of the turn-off of the thyristor 3, the anode of the thyristor 3 is reversely biased by the voltage of the turn-off capacitor 4b in the polarity of FIG. 8 when the turn-off thyristor 5, that is, the anode reverse-bias switch 5, is turned on at the time $t_2$. The anode reverse-voltage $V_3$ is applied as the gate reverse pulse voltage $V_{10}$ through the circuit of cathode K-gate G-inductive element 11 - diode 12a whereby the reverse gate current $i_{gr}$ is increased as shown by the waveforms during the period $t_2$– $t_4$ in FIG. 9, a and b. When the turn-off capacitor 4b is charged by the load current to the reverse polarity to that of FIG. 8, the anode voltage $V_3$ is raised in the forward direction to rise to the voltage $E_1$ of the power source 1. After the forward direction voltage initiation time $t_4$, the diode 12 is turned on to maintain the reverse gate current $i_{gr}$ as it gradually decreases. Thus, the reverse current having the waveform B of FIG. 9b can be confirmed until the time $t_6$. As stated above, the gate reverse-bias can be effectively attained and the gate reverse-bias means can be simplified. Moreover, in the case of FIG. 8, the anode reverse-bias voltage $V_3$ gradually increases in a forward direction as shown in FIG. 9a whereby the satisfactory turn-off effect can be attained even though the diode 12 is detected. That is, in the reverse gate current $i_{gr}$ as shown in FIG. 9b by the dotted line A, the reverse gate current is maintained until the time the maximum forward voltage is reached at $t_5$ so that the period $t_4$– $t_5$ can be prolonged as desired.

Figure 10:
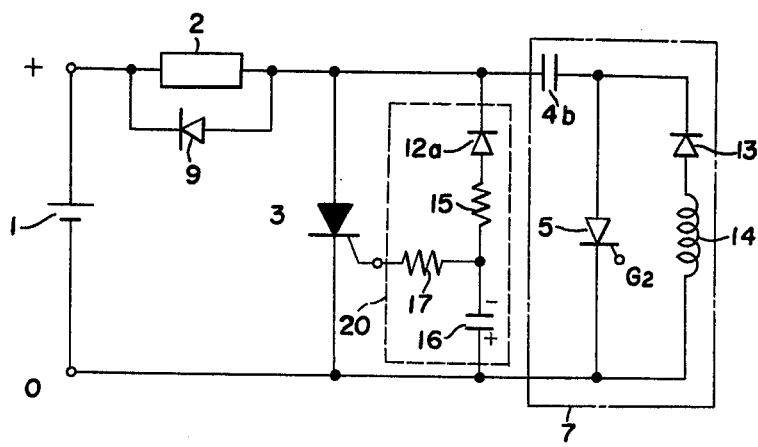
FIG. 10 is a connection diagram of the third embodiment of the thyristor turn-off system according to the invention.
Figure 11:
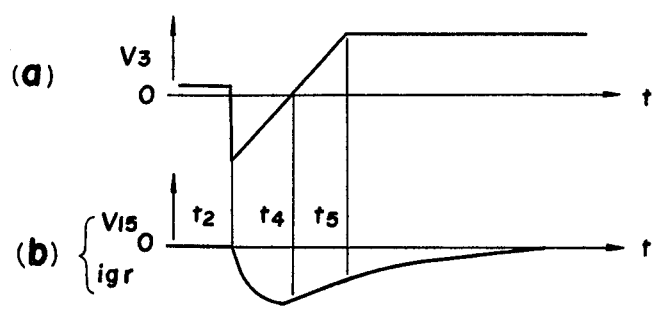
FIG. 11, a and b, shows time charts of waveforms for illustrating the operation of the system of FIG. 10.

FIG. 10 is a diagram of another embodiment of the invention. In this embodiment, the anode reverse-bias means is used for both the first reverse-bias means 7 and the gate reverse-bias pulse generating means 10 in a manner similar to that of FIG. 8. However, the connection of the gate reverse-bias gate circuit 20 is slightly different from that of FIG. 8. The series circuit of the diode 12a, the charging resistor 15 and the capacitor 16 is connected in parallel to the thyristor 3. The connection of the charging resistor 15 and the capacitor 16 is connected through the resistor 17 to the gate of thyristor 3. The charging resistor 15 is to charge the capacitor 16 during the anode reverse-bias period of the thyristor 3 ($t_2$– $t_4$) (FIG. 11, a and b). During the anode reverse-bias period, the capacitor 16 is charged to the polarity of FIG. 10 and the gate reverse-bias is maintained by the charge until after the application of the anode forward voltage whereby a similar result can be attained as that of the former embodiment.

Figure 12:
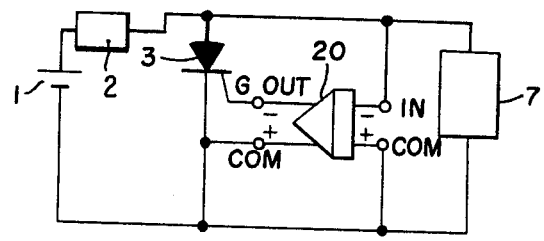
FIG. 12 is a simplified block diagram for the circuit diagrams of FIGS. 8 and 10.

FIG. 12 is a simplified diagram for the embodiments of FIG. 8 and FIG. 10. In FIG. 12, the reference 20 designates a reverse gate energy storage element to store energy by the input of the reverse direction terminal voltage of the thyristor 3, (integrating element of inductive element 11 or capacitor 16) so as to apply it to the gate of thyristor 3 as the reverse-bias. The reference IN designates an input terminal; OUT designates an output terminal and COM designates an input and output common terminal.

Figure 13:
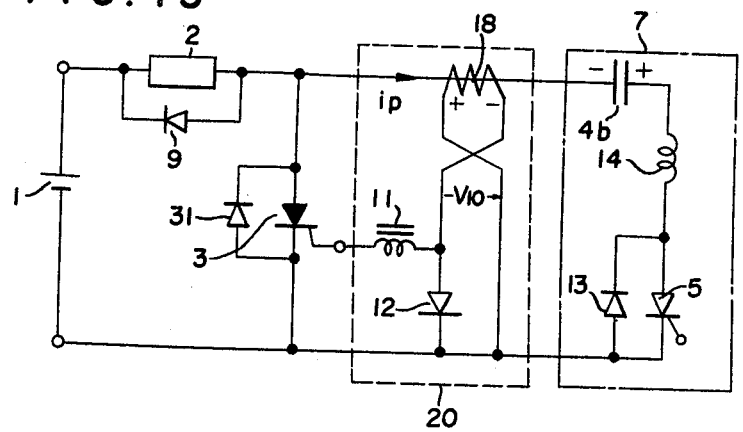
FIG. 13 and FIG. 14 are circuit diagrams for the fourth and fifth embodiments of the thyristor turn-off system according to the invention.
Figure 14:
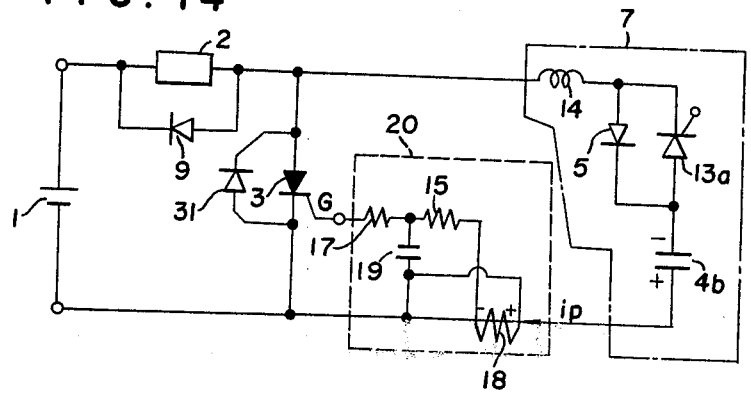

FIGS. 13 and 14 are respectively diagrams of other embodiments of the invention wherein the anode reverse-current pulse is also used as the gate reverse-bias pulse generating means 10 in the case using the anode reverse-bias means 7 by the pulse current.

The embodiment of FIG. 13 will now be described. In this embodiment, the diode 31 is connected in reverse parallel to the thyristor 3. In the first reverse-bias means 7, the series circuit of the capacitor 4b, the reactor 14 and the anode reverse-bias switch (thyristor) 5 is connected in parallel to the thyristor 3. The diode 13 is connected in reverse parallel to the anode reverse-bias switch 5. On the other hand, the gate reverse-bias gate circuit 20 comprises the pulse current transformer 18, the diode 12 and the inductive element 11. The pulse current transformer 18 is disposed between the branches of the anode reverse-current pass. One end of the secondary winding of the transformer is directly connected to the cathode of thyristor 3. The other end of the secondary winding of the transformer is connected through the diode 12 to the cathode of thyristor 3. The inductive element 11 is connected between the anode of diode 12 and the gate of thyristor 3.

In FIG. 13, as stated above, the gate reverse-bias (discharge of carriers around the junction $J_2$ by the gate reverse-bias during the anode reverse-bias period and its blocking ability recovery effect) is improved by the diode 31 whereby the gate reverse bias effect (reverse biasing of the junction $J_2$ by the gate reverse-bias) is not permitted to be disturbed by the anode reverse-bias. In the anode reverse-bias means, that is, the first reverse-bias means 7, the reactor 14 is connected in series to the capacitor 7 at the time the anode reverse-bias switch 6 is turned on to give a ringing operation. The diode 31 connected in reverse parallel to the thyristor 3 is biased by the resonance pulse current $i_p$.

At this time, the pulse voltage $V_{10}$ in the polarity of FIG. 13 is generated by the pulse current transformer 18 in the output side of the pulse current transformer 18. In a manner similar to the embodiment of FIG. 8, the gate reverse-bias performance is realized.

On the other hand, in the embodiment of FIG. 14, the first reverse-bias means of the series circuit of the reactor 14, the anode reverse-bias switch (diode) and the capacitor 4b is connected in parallel to the thyristor 3. The thyristor 13a is connected in reverse parallel to the anode reverse-bias switch 5 instead of the diode 13 of FIG. 13. The gate reverse-bias gate circuit 20 comprises resistors 15, 17, capacitor 19 and pulse current transformer 18. The resistor 17 and the capacitor 19 are connected in series between the gate and cathode of the thyristor 3. The output side of the pulse current transformer 18 is connected through the resistor 15 in parallel to the capacitor 19. The pulse current transformer 18 is disposed between the cathode of thyristor 3 and the capacitor 4b. As shown in FIG. 14, the capacitor 19 is used as the reverse-gate energy storage element. This feature is only different from that of FIG. 13.

Figure 15:
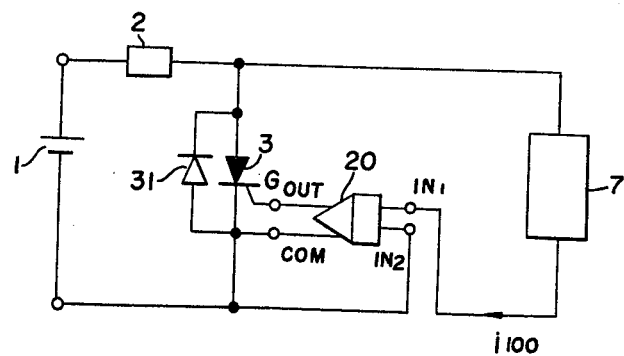
FIG. 15 is a simplified block diagram for illustrating circuit diagrams of FIGS. 13 and 14.

In the embodiments of FIG. 13 and FIG. 14, the pulse current transformer 18 functions to obtain the gate reverse-bias energy from the anode reverse-bias means instead of the diode 12a of the embodiment of FIG. 10. The simplified diagram thereof is shown in FIG. 15. In FIG. 15, $IN_1$ and $IN_2$ designate input terminals. The insulation between the input and the output can be attained by using the pulse current transformer 18 which can be inserted in a desirable passage of the anode reverse-bias pulse current loop.

Figure 16:
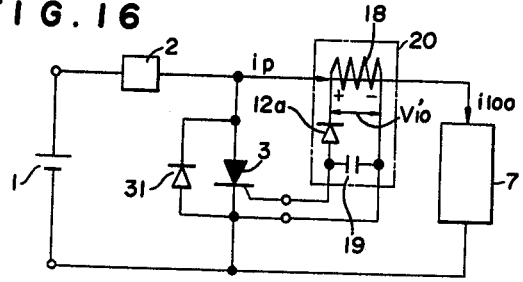
FIG. 16 is a connection diagram of the sixth embodiment of the thyristor turn-off system according to the invention.

FIG. 16 is a diagram of another embodiment of the invention wherein the pulse current transformer 18 itself is used as the gate reverse-bias energy storage element.

Figure 17:
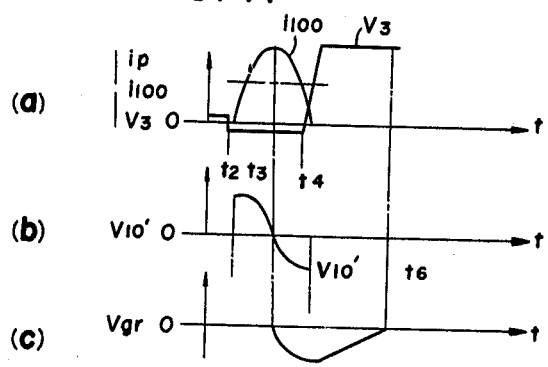
FIG. 17, a–c, shows waveforms for illustrating the operation of the system of FIG. 16.

The performance of the embodiment of FIG. 16 will be illustrated with reference to the performance waveforms of FIG. 17, a-c. As shown by the current $i_{100}$ of FIG. 17a, the anode reverse-bias pulse current is passed to the first reverse-bias means 7. When the anode voltage of thyristor 3 for the current is $V_3$ of FIG. 17a; and the magnetic core of the pulse current transformer 18 is in the form of a reactor (mutual inductor), the induction voltage $V_{10'}$ of the secondary winding is as shown in FIG. 17b. That is, the energy is stored in the pulse current transformer 18 during the period the anode reverse-bias pulse current $i_{100}$ increases; the energy is discharged during the period the anode reverse-bias pulse current $i_{100}$ decreases, and the gate reverse-bias pulse voltage $V_{10'}$ is in reverse polarity to that of FIG. 16. The voltage is also stored through the diode 12a to the capacitor 19 whereby the gate reverse-bias voltage $V_{gr}$ is maintained as shown in FIG. 17c even after extinction of the anode reverse-bias pulse current $i_{100}$. Thus, the embodiment of FIG. 16 attains the result of the invention.

Figure 18:
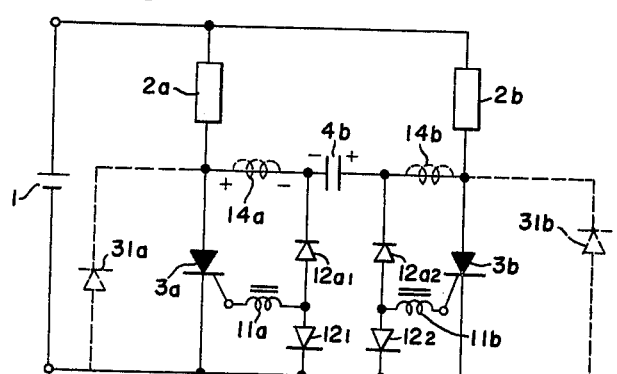
FIG. 18 and FIG. 19 are circuit diagrams for applications of the thyristor turn-off system.

FIG. 18 is a diagram of one embodiment of an inverter to which the invention is applied and is one application of the embodiment of FIG. 8. In FIG. 18, the references 2a, 2b designate loads such as primary windings of output transformers having a tap and 4b designates a capacitor for turn-off which is used for both of main thyristors 3a, 3b. The other thyristor 3a or 3b is used for the anode reverse-bias switch 5a or 5b. In FIG. 18, as shown by the dotted line, the diodes 31a, 31b are connected in reverse parallel to the thyristors 3a, 3b and the capacitor 4b and the reactors 14a, 14b are connected in series between both anodes of thyristors 3a, 3b.

In FIG. 18, the embodiment can be modified to the reverse-bias method. In this case, when the thyristor 3a is turned off, the capacitor 4b having the polarity of FIG. 18 is discharged through the thyristor 3b to pass the reverse-bias pulse current to the diode 31a in reverse parallel connection. In this case, the voltage is applied to the reactor 14a in the polarity of FIG. 18. The potential of the cathode of diode $12a_1$ is lower than the potential of the cathode of thyristor 3a in the degree of the applied voltage. During this period, the gate reverse-bias energy is accumulated in the induction element 11a and the gate reverse-bias is initiated. The gate reverse-bias continues to gradually decrease through the diode 12 even after extinction of the anode reverse-bias pulse. The embodiment can be modified with various singal phase and multi-phase inverters.

Figure 19:
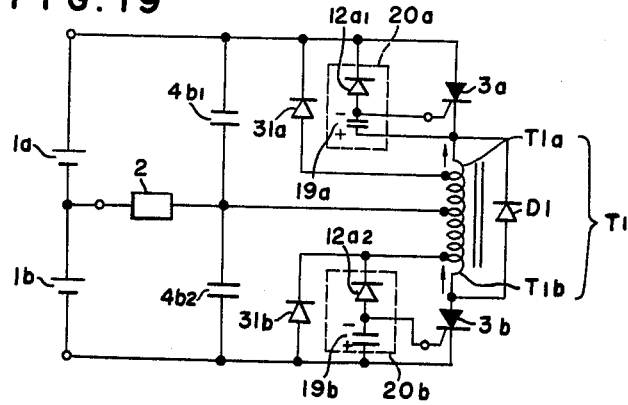

FIG. 19 is a diagram of another embodiment of the invention wherein two main thyristors 3a, 3b are connected in series to form a basic circuit for complimentary commutation between the thyristors 3a, 3b. In FIG. 19, the diodes 31a, 31b are connected to the partial windings $T_{1a}$, $T_{1b}$ of the commutation pulse transformer whereby the anode reverse-bias voltages of the thyristors 3a, 3b are controlled to lower the voltage so as to effectively discharge the carriers around the junction $J_2$ by the gate reverse-bias and to charge directly from the diodes $12a_1$, $12a_2$ to the capacitors 19a, 19b in the gate reverse-bias energy accumulation and to directly realize the gate reverse-bias for the voltage. The gate reverse-bias means can be simplified by this embodiment.

In FIG. 19, the reference $D_1$ designates a diode for controlling the increase of the forward direction reapplying voltage in the thyristors 3a, 3b by imparting a reverse voltage after actuation of the commutation pulse transformer $T_1$. In accordance with the invention, the gate reverse-bias is applied for a specific period after the anode reverse-bias until after the forward-bias initiation time. The forward voltage blocking in the remaining carriers can be attained whereby the turn-off period can be remarkably shortened. Accordingly, the turn-off means can be simplified.

The diode is outwardly connected or internally connected as IC in reverse parallel to the main thyristor whereby the discharge of carriers around the middle junction $J_2$ by the gate reverse-bias, that is, the turn-off operation, can be effectively performed. Also, the gate reverse-bias is applied until after the anode forward bias initiation time. The gate reverse-bias is gradually decreased whereby the gate reverse-bias can correspond to the condition of a decrease of the remaining amount of carriers of the thyristor, the injection carriers remain and the continuation of forward direction leakage and forward direction loss can be attained by an excess of reverse-gate current continuation.

The breakover of the thyristor can be prevented by suddenly stopping the reverse gate current from the condition of excess reverse gate current and the high reverse gate bias power which is remarkably higher than that of the turn-on gate. A loss thereof can be greatly decreased. Accordingly, the loss of thyristor and the gate circuit can be decreased and the simplification of the reverse-gate circuit can be attained. Moreover, the gate reverse-bias energy accumulating element for accumulating the anode reverse-bias power given from the anode reverse-bias means is provided so as to attain the gate reverse-bias whereby the reverse gate bias means can be further simplified as well as the above-mentioned results.

The induction element is connected in series to the gate electrode and the diode is connected in reverse parallel to the input terminal of the induction element in reverse polarity to the gate reverse-bias pulse voltage. Accordingly, a similar result can be attained by the simple reverse gate bias circuit by applying the reverse gate bias pulse voltage between the input terminals of the induction element. Accordingly, the power consumption for the reverse gate bias can be decreased.

Moreover, needless gate reverse-bias during the anode reverse recovery -period (reverse current period) can be eliminated by delaying the gate reverse-bias period after the anode reverse-bias period whereby the turn-off of the thyristor is effectively attained, the gate reverse-bias power consumption can be decreased and the switching loss advantageously decreased.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A high speed method of turning off a thyristor in the conducting state, said thyristor having at least an anode, a cathode and a gate, comprising the steps of:
   applying a reverse-bias between the anode and cathode of said thyristor;
   applying a reverse-bias to the gate of said thyristor;
   applying a forward-bias between the anode and cathode of said thyristor while continuing to apply the reverse-bias to the gate of said thyristor; and
   subsequently removing the reverse-bias from the gate of said thyristor.

2. The high-speed method of turning off a thyristor in the conducting state recited in claim 1 including the step of:
   decreasing gradually the reverse-bias applied to the gate of said thyristor subsequent to the step of applying a forward-bias between the anode and cathode of said thyristor.

3. The high-speed method of turning off a thyristor in the conducting state recited in claim 1 including the step of:
   providing a low-resistance path for current flow from the cathode to the anode of said thyristor while applying the reverse-bias to the gate of said thyristor.

4. A thyristor high speed turn-off system comprising:
   a thyristor having at least an anode, a cathode and a gate;
   first reverse-bias means for applying reverse-bias voltage between the anode and cathode of said thyristor; and
   second reverse-bias means for applying reverse-bias to the gate of said thyristor, said second reverse-bias means coupled to said first reverse-bias means and including means for integrating the reverse-bias voltage applied between the anode and cathode of said thyristor to apply the integrated voltage as reverse-bias to the gate.

5. The thyristor high speed turn-off system according to claim 4 wherein said integrating means includes a capacitor.

6. The thyristor high speed turn-off system according to claim 4 wherein said integrating means includes an inductive element.

7. A thyristor high speed turn-off system comprising:
   a thyristor having at least an anode, a cathode and a gate;
   a gate reverse-bias circuit including an inductive element and a diode serially connected across the gate and the cathode of said thyristor; and
   gate reverse-bias pulse generating means connected in parallel to said diode of said gate reverse-bias circuit for applying reverse-bias voltage pulses to the gate of said thyristor.

* * * * *